United States Patent [19]

Singhdeo

[11] Patent Number: 4,739,443
[45] Date of Patent: Apr. 19, 1988

[54] THERMALLY CONDUCTIVE MODULE

[75] Inventor: Narendra N. Singhdeo, New Haven, Conn.

[73] Assignee: Olin Corporation, New Haven, Conn.

[21] Appl. No.: 75,700

[22] Filed: Jul. 20, 1987

Related U.S. Application Data

[63] Continuation of Ser. No. 814,869, Dec. 30, 1985, abandoned.

[51] Int. Cl.⁴ ............................................. H05K 7/20
[52] U.S. Cl. .................... 361/382; 361/385; 361/414; 174/68.5
[58] Field of Search ................ 361/382, 383, 385–388, 361/395, 401, 414; 357/81, 82; 174/68.5

[56] References Cited

U.S. PATENT DOCUMENTS

| | | | |
|---|---|---|---|
| 4,320,438 | 3/1982 | Ibrahim | 361/401 |
| 4,381,032 | 4/1983 | Cutchaw | 165/46 |
| 4,383,270 | 5/1983 | Schelhorn | 357/71 |
| 4,385,202 | 5/1983 | Spinelli et al. | 174/68.5 |
| 4,415,025 | 11/1983 | Horvath | 165/185 |
| 4,491,622 | 1/1985 | Butt | 428/632 |
| 4,589,057 | 5/1986 | Short | 361/385 |
| 4,602,318 | 7/1986 | Lassen | 361/401 |

OTHER PUBLICATIONS

"Microelectrical Packaging" by Blodgett, Jr. in *Scientific American*, Jul. 1983, vol. 249, No. 1, pp. 86–96.
"Semiconductor Module with Improved Air Cooling" by Zirnis in *IBM Technical Disclosure Bulletin*, vol. 20, No. 5, Oct. 1977.
"Wafer Processing Developments" by Murray, *Semiconductor International*, Nov. 1985, p. 28.

Primary Examiner—G. P. Tolin
Attorney, Agent, or Firm—Gregory S. Rosenblatt; Paul Weinstein

[57] ABSTRACT

A thermally conductive module is adapted for mounting a plurality of electronic components. A ceramic substrate has a first layer of foil glass bonded thereto and adapted for mounting a plurality of electronic components thereon. A second layer of foil is glass bonded to a second surface of the ceramic substrate and is adapted to conduct heat from the module.

31 Claims, 1 Drawing Sheet

THERMALLY CONDUCTIVE MODULE

This application is a continuation of application Ser. No. 814,869 filed on Dec. 30, 1985, now abandoned.

This application is related to U.S. patent application Ser. No. 413,046 entitled "Multi-Layer Circuitry" by Sheldon H. Butt, filed Aug. 30, 1982; U.S. patent application Ser. No. 587,411 entitled "Tape Packages" by Sheldon H. Butt, filed Mar. 8, 1984; U.S. patent application Ser. No. 587,433 entitled "Tape Bonding Material And Structure For Electronic Circuit Fabrication" by Sheldon H. Butt, filed Mar. 8, 1984; U.S. patent application Ser. No. 651,984 entitled "Sealing Glass Composite" by Edward F. Smith, III, filed Sept. 19, 1984 (now abandoned); U.S. patent application Ser. No. 651,987 entitled "Sealing Glass Composite" by Edward F. Smith, III, et al., filed Sept. 19, 1984 (now abandoned); U.S. patent application Ser. No. 707,636 entitled "Pin Grid Arrays" by Michael J. Pryor, filed Mar. 4, 1985 (now abandoned); U.S. patent application Ser. No. 811,908 entitled "Steel Substrate With Bonded Foil" by Richard A. Eppler, filed Dec. 20, 1985 (now abandoned); U.S. patent application Ser. No. 811,905 entitled "Hybrid And Multi-Layer Circuitry" by Michael J. Pryor et al., filed Dec. 20, 1985; U.S. patent application Ser. No. 811,846 entitled "Metal-Glass Laminate" by Charles J. Leedecke et al., filed Dec. 20, 1985; U.S. patent application Ser. No. 811,911 entitled "A Hermetically Sealed Package" by Michael J. Pryor et al., filed Dec. 20, 1985; U.S. patent application Ser. No. 811,910 entitled "A Method Of Joining Metallic Components" by Michael J. Pryor et al., filed Dec. 20, 1985; U.S. patent application Ser. No. 811,907 entitled "Hybrid And Multi-Layer Circuitry" by Michael J. Pryor, filed Dec. 20, 1985; U.S. patent application Ser. No. 811,906 entitled "Multi-Layer And Pin Grid Circuit Arrays" by Michael J. Pryor, filed Dec. 20, 1985; and U.S. Pat. No. 4,491,622 entitled "Composites Of Glass-Ceramic To Metal Seals And Method Of Making The Same" by Sheldon H. Butt, issued Jan. 1, 1985.

While the invention is subject to a wide range of applications, it is particularly suited for a thermally conductive module housing a plurality of semiconductor devices and will be particularly described in that connection. In particular, the module includes thermally conductive layers of foil disposed at different locations within a module for dissipating heat from the electronic components mounted therein.

Thermal management is one of the most significant concerns in the present day electronics industry. Ever since the first transistor was invented, scientists and engineers have been increasing the density of the electronic elements per unit area. That trend continues. The increase in density of electronic elements, such as in modules containing many integrated circuit chips or dice, also increases the heat input into that area. Heat dissipation becomes a significant factor because inefficient heat transfer causes an increase in the operating temperature of the chips and a corresponding reduction in their reliability. Typically, a change in operating temperature of about 25° C. results in a reduction in reliability of about 25 to about 50%. Restated, the chip is prone to malfunction in three fourths to one half the time. Thus, the ability to withdraw the heat from a certain area puts a practical limit on the desnity of electronic elements (transistors, IC's, etc.) per unit area or unit space.

Densification of electronic systems is achieved at two levels. At the chip level, higher densities are obtained with finer geometries with fine line optical lithography. The practical limit for optical lithography is dictated by the wave length of light. The resolution limit is larger than the wave length of the light used. Although x-ray and electron beam lithography techniques can produce better resolutions than with optical lithography, the extreme increase in cost to implement these techniques inhibits their application. The semiconductor industry is already burdened with extremely high capital expenditures involving the optical lithography techniques.

These issues have been addressed by the approaches disclosed in U.S. Pat. Nos. 4,531,146, 4,381,032, 4,415,025, in articles entitled "Microelectronic Packaging" by Blodgett, Jr. in *Scientific American,* July 1983, Vol. 249, No. 1, pages 86-96 and "Semiconductor Module With Improved Air Cooling" by Zirnis in *IBM Technical Disclosure Bulletin,* Vol. 20, No. 5 (October 1977). Another approach has been cited in the case of the etched silicon work done by SRC at Stanford University as described in the article entitled "Wafer Processing Developments" by Murray, *Semiconductor International,* November, 1985, page 28. This design offers the specific advantage of separating the cooling part from the silicon chip. The extra step involved in cutting grooves in a silicon chip, especially in a finished state and connection of conduits to such channels would be considerably more expensive than this method at similar levels of performance.

At the bond level, the density of packaged chips is also limited by the heat output of the assembly per unit area. Densification of the board is also being studied and strides are being made in that area. Examples of techniques are described in U.S. Pat. Nos. 4,383,270, 4,385,202 and 4,491,622.

It is a key factor to demonstrate that the conductors can be used both for thermal and electrical connection. Thick film conductors, presently used in the art, can be used for electrical conduction. Whenever they are utilized for heat dissipation, it is used in conjunction with metal pieces. The thick film provides a metallic layer to attach the metal pieces to the ceramic with the help of metallic solders.

It is a problem underlying the present invention to provide a thermally conductive module and process of forming the module which is capable of dissipating heat generated by a plurality of electronic components associated with the module.

It is an advantage of the present invention to provide a thermally conductive module and process of forming the module which obviates one or more of the limitations and disadvantages of the described prior structures and arrangements.

It is a further advantage of the present invention to provide a thermally conductive module and process of forming the module wherein the module provides enhanced thermal dissipation.

It is a yet further advantage of the present invention to provide a thermally conductive module and process of forming the module wherein a plurality of semiconductor chips are housed and hermetically sealed therein.

It is a still further advantage of the present invention to provide a thermally conductive module and process of forming the module which is relatively inexpensive to manufacture.

It is another advantage of the present invention to provide a thermally conductive module and process of forming a module which includes conduits in various layers of the module carrying heat conducting fluid for enhancing the rate of heat removal from the module.

Accordingly, there has been provided a thermally conductive module adapted for mounting a plurality of electronic components. A ceramic substrate has a first layer of foil glass bonded thereto and is adapted for mounting a plurality of electronic components thereon. A second layer of foil is glass bonded to a second surface of the ceramic substrate and is adapted to conduct heat from the module.

The invention and further developments of the invention are now elucidated by means of the preferred embodiment shown in the drawings.

Figure 1:
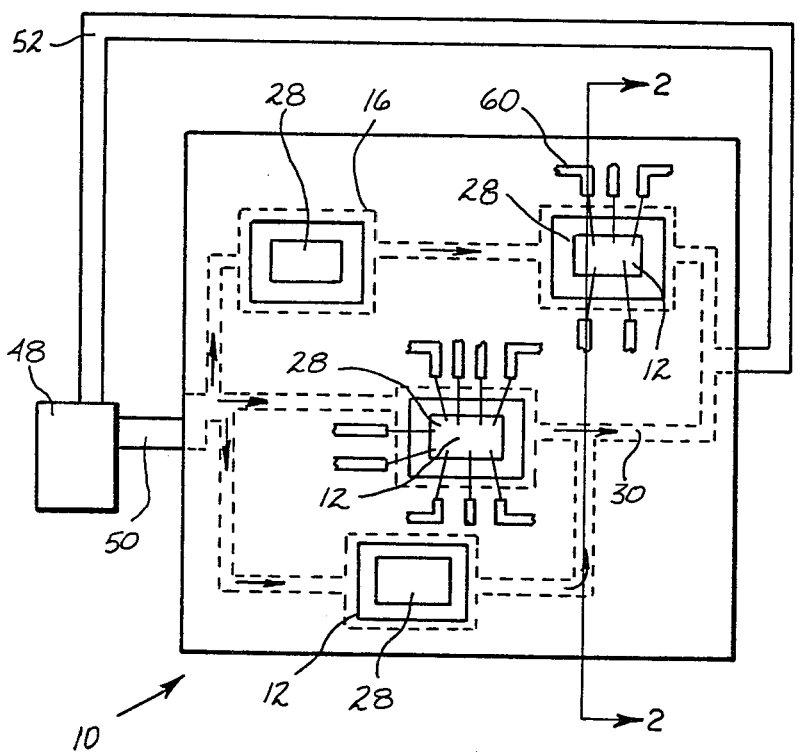
FIG. 1 is a top plane view of a thermally conductive module illustrating the heat dissipating channels by the dotted lines.

The present invention is directed to a thermally conductive module 10 adapted for mounting a plurality of electronic components 12. The module comprises a first ceramic substrate 14 with a first layer of metal or alloy foil 16 disposed on a first surface 18 of the ceramic substrate. The first layer of foil 16 is adapted for mounting electronic components 12 thereon. A first layer of bonding glass 20 bonds the first layer of foil 16 to a first surface 18 of the ceramic substrate. A second layer of metal or alloy foil 22 is disposed on a second surface 24 of the first substrate. The second layer of foil is adapted to conduct heat from the module 10. A second layer of bonding glass 26 bonds the second layer of foil to the second surface of the ceramic substrate 14.

The present invention is specifically directed to the dissipation of heat from one or more silicon chips which may be mounted on a single or multi-layer substrate. By utilization of copper or other highly thermal conductive materials which can be bonded to the ceramic substrate, excellent heat dissipation can be obtained. For example, layers of copper foil may be strategically located in the form of islands, streets and vias for the sole purpose of conducting heat from the substrate. Channels or tubes may be formed in the copper foils so that fluids can be pumped therethrough to efficiently conduct the heat away from the substrate. The location, distribution and configuration of the heat dissipating layers of conductive material may be determined by suitable computer simulation or other appropriate means in order to optimize the use of the available space on the board, substrate or chip within the heat dissipation structure.

Referring to FIG. 1, there is shown a multi-layer, thermally conductive module 10 which incorporates the principles of the present invention. A multi-layer module 10 is illustrated with a plurality of die attach substrates formed from a first foil 16 which is glass bonded onto a ceramic substrate 14. The foil 16 may be formed into any configuration by conventional techniques such as photo-etching. For example, the foil may be shaped into a plurality of islands 28 and circuit conductors 29. Although only a small number of circuit conductors are illustrated, it is within the scope of the present invention to provide any number of conductors as required.

Figure 2:
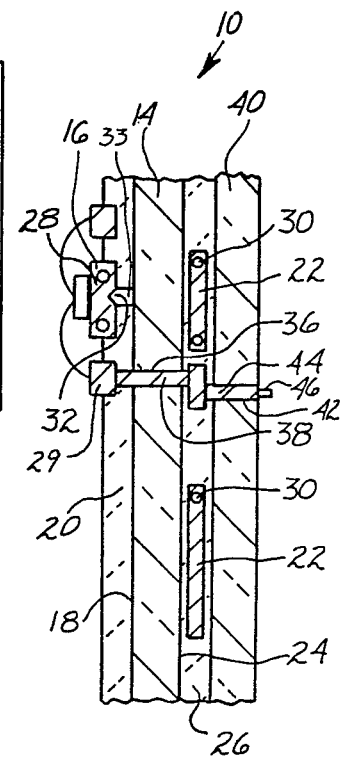
FIG. 2 is a schematic cross-sectional side view through Section 2—2 of FIG. 1.

An important aspect of the present invention relates to the heat dissipation passages indicated by the dotted lines in FIG. 1. These dotted lines illustrate the heat dissipation passages formed in the second layer of foil 22 as seen in FIG. 2. This layer of foil may be bonded with a glass 26 to the surface 24 of the ceramic substrate 14. The foil preferably includes a plurality of channels or conduits 30 to provide a path for a coolant fluid. These channels, having any desired cross-section, may be cut into the foil by any desired technique such as with an electronic drilling machine. The channels may have a diameter as small as about 1 mil. Depending upon the complexity of the heat dissipation layer of foil 22, it may be provided as a single layer of foil in which the conduits or channels are preferably formed before the foil is glass bonded to the substrate. It is also within the terms of the invention to glass bond the foil to the substrate and then form the passageways as required. If necessary, selected portions of the passageways may be filled with glass, a eutectic or other suitable adhesives to form the desired fluid paths. It is also within the terms of the present invention to etch the foil into the desired configuration, pre-drill it and then bond it with glass 26 to the substrate 14. If desired, open fluid channels, or conduits 32, of any desired configuration, may also be formed in a desired foil layer by any conventional process such as photo-etching. Then a layer of bonding glass may be screen printed onto the side of the layer of foil having the etched conduits. When the foil is then bonded to the substrate, closed conduits 33 are formed between the foil and the substrate. This again is a significant advantage over the Semiconductor Research Council (SRC) and Stanford design of etched channels in silicon, as the channels there are an integral part of the silicon and can be formed by etching alone. Etching either by wet (chemical) or dry (plasma) methods are relatively more expensive compared to the techniques described above.

The foil is selected from a copper alloy material, such as one ounce foil, which has been deoxidized. Using a deoxidized copper alloy foil is particularly important to prevent blistering within the foil or at the interface with the bonding glass 20 as will be further described herein.

It is also within the terms of the present invention to select the foil 30 from an oxygen free copper which is typically an electrolytic copper substantially free from cuprous oxide and produced without the use of residual metallic or metalloidal deoxidizers. Generally, the composition of oxygen free copper is at least 99.95% copper with silver being considered as copper. Examples of oxygen free copper include CDA 10100, CDA 10200, CDA 10400, CDA 10500 and CDA 10700.

In addition to the foil 22 for conducting heat away from the module 10, circuitry may be provided in the same structural layer as the foil 22. In this case, one or more through-holes 36 may be formed through the substrate 14. The through-holes may be filled with a conductor 38 such as a conventional conductive paste, a solid conductive wire or plated by techniques such as electroless plating and/or electroplating and filled with a conductor such as solder. The first conductor 38 is disposed within the first through-hole 36 and is in contact with the foil conductors 29 and circuit foil layer.

The bonding glass layers 20 and 26 for bonding the ceramic substrate 14 to the foil layers 16 and 22 is preferably selected from a bonding glass which forms a flowable mass at a temperature below about 1000° C. The glass is further selected to adhere to both the ceramic substrate and the metallic foils. The glass may be selected from the group consisting of silicate, borosilicate, phosphate and zinc borosilicate glasses. Preferably, the selected glass is a borosilicate glass of a general composition $MO-B_2O_3-SiO_2$, where $MO=BaO$, CaO, $ZrO_2$, $Al_2O_3$, MgO, $K_2O$, $Na_2O$, ZnO, SrO, and mixtures thereof. The expansion of the glass can be altered by adjusting the constituents or through the addition of appropriate fillers such as cordierite, beta eucryptite or zirconium silicate. Preferably, the glass will be adjusted to have a coefficient of thermal expansion (CTE) in the range of about $50 \times 10^{-7}$ to about $100 \times 10^{-7}$ in/in/°C. More particularly, the CTE of the glass will be slightly less than the substrate in order that the bonded glass is in compression. For example, with a substrate of alumina, the glass would preferably have a CTE of about $66 \times 10^{-7}$ to about $70 \times 10^{-7}$ in/in/°C. The glass is selected to form a flowable mass within the temperature range from about 500° to about 1000° C. and most preferably from about 600° to about 950° C.

A second ceramic substrate 40 may be bonded to the glass 26 so as to form a conventional multi-layer circuit assembly. A second through-hole 42 filled with a conductor 44, both of which are essentially the same as the through-hole 36 and conductor 38 described herein, may be provided. A number of different approaches may be taken as to the order and technique of constructing the multi-layer circuit assembly as more fully described in U.S. patent application Ser. No. 811,905 which is incorporated by reference herein. Finally, conductor pin 46 is bonded to the conductor 44 and extends outward from the module 10.

An important aspect of the present invention is the provision of means to pump a cooling fluid, such as freon or water, through the conduits or piping 30 and 32. A fluid source 48 may be connected by an inlet pipe 50 and an outlet pipe 52 to the piping. With freon, the heat generated by the chips would vaporize the freon and cause it to flow towards the source 48, which acts as a heat sink. It is also within the terms of the present invention to provide a heat exchanger in the fluid circuit. Once the vaporized freon comes in contact with the fluid freon in source 48, it would turn to liquid. As the cycle repeats itself, a pumping of the freon through the circuit results. If desired, a fractional horsepower pump could be combined with source 48, to pump a liquid through the system.

The thermally conductive module 10 is illustrated with two ceramic substrates 14 and 40. The ceramic substrates may each be formed from ceramic sheet (green sheet) which may be constituted of materials including alumina silicate, silicon carbide, zirconia, zircon, beryllia, alumina having a purity of about 90 to about 99% and mixtures thereof. Preferably, the ceramic material is a commercial 96% alumina which typically includes about 94.5% $Al_2O_3$ and the remainder including silica, manganese, calcium, and magnesium. It is also within the terms of the present invention to use combinations of the ceramic materials mentioned above or other ceramic materials as desired.

Figure 3:
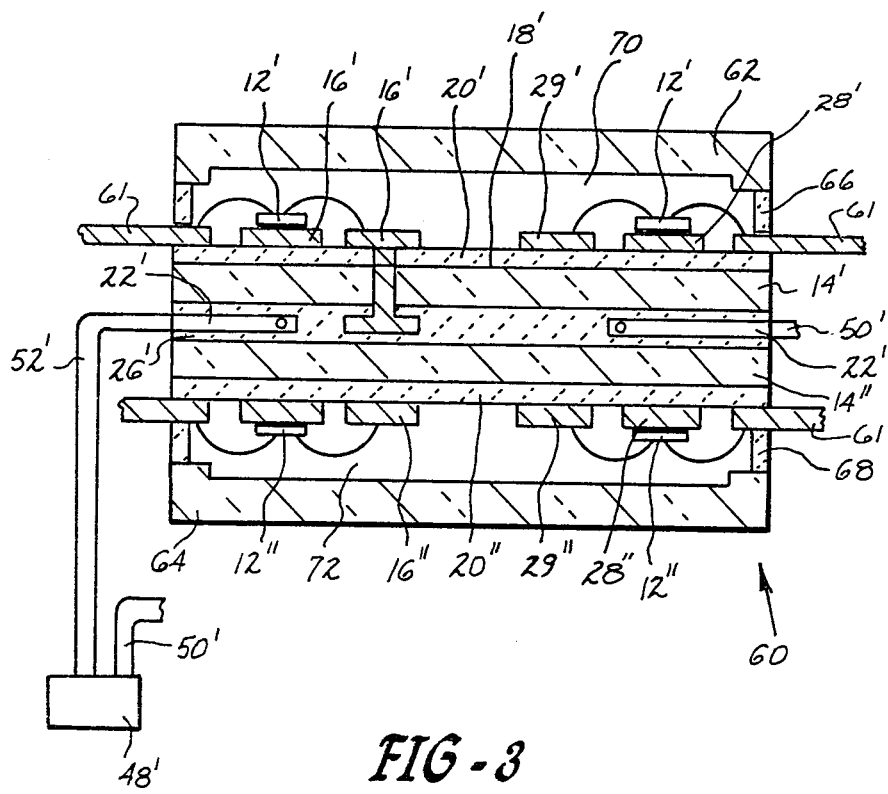
FIG. 3 is a schematic cross-sectional side view of a hermetically sealed semiconductor casing in accordance with the present invention.

In a second embodiment of the present invention, a hermetically sealed, thermally conductive module 60 is provided as shown in FIG. 3. The primed and double primed reference numerals indicated components which are essentially the same as the components indicated by the unprimed reference numerals. The embodiment of FIG. 3 may be constructed using the basic module 10 shown in FIG. 2. Substrates 14' and 14" are provided with glass coatings 20',20". First and third layers of foil 16',16" are bonded to a first surface 18',18" of the substrates with the first and third layers of glass 20',20". The foil layers may be formed into lands 29',29" and die attach substrates 28', 28". Chips 12',12" are bonded to the substrates 14' and 14" by any conventional means such as a gold eutectic. A second layer of foil 22' is disposed in a second glass layer 26' to enhance thermal conduction of heat from the chips 12' and 12" disposed on either side of the foil 22'. The foil 22' includes at least first and second channels which may be connected to a coolant source 48' by inlet pipe 50' and 52'. The coolant is preferably freon but may also be water, organic or any other desired coolant.

The piping configuration in foil layer 22' is preferably formed prior to glass bonding the foil layer between the ceramic substrates using any desired techniques as described above. Next, the chips are electrically connected to levels 29' and 29" and to the externally extending leads 61. Ceramic covers 62 and 64, preferably selected from the same material as the substrates 14', 14" may then be bonded onto the substrates with a sealing glass composite 66, 68.

The glass matrix of the sealing glass composite 66,68 is preferably a complex lead borate type glass matrix generally also containing one or more other glass components, such as zinc, aluminum, silicon, barium and tin which are normally present in their respective oxide forms. These lead borate type solder glasses usually have a coefficients of thermal expansion of about $80 \times 10^{-7}$ to about $130 \times 10^{-7}$ in/in/°C. over the temperature range from ambient to their glass transition temperatures (typically about 300° C.).

Such glasses are used in forming vitreous seals and glass-ceramic or semicrystalline seals as known in the electronic packaging art. Weight percent compositional ranges are set forth below in Table I where the total content of all oxides is 100 percent.

TABLE I

| Oxide | Broad Range (wt. %) | Preferred Range (wt. %) |
|---|---|---|
| PbO | 70–85 | 75–85 |
| ZnO | 0–20 | 0.5–16 |
| $B_2O_3$ | 5–15 | 8–15 |
| $SiO_2$ | 0–10 | 0–5 |
| BaO | 0–3 | 0–2 |
| $SnO_2$ | 0–5 | 0–2 |

Other conventional glassmaking oxides such as CaO, $Bi_2O_3$, $Na_2O$, $K_2O$, $Li_2O$, CdO, and $Fe_2O_3$ can be included. However, it is preferred in many instances not to employ these ingredients but rather to constitute the glass matrix of essentially only those ingredients set forth in Table I above.

Although the invention has been described in terms of glass bonding a foil to a ceramic substrate, it is also within the terms of the present invention to substitute a metal or plastic material for the ceramic substrate.

The patents, patent applications and articles set forth in this application are intended to be incorporated by reference herein.

It is apparent that there has been provided in accordance with this invention a thermally conductive module which satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternative, modifications and all variations as fall within the spirit and broad scope of the appended claims.

I claim:

1. A thermally conductive module adapted for mounting a plurality of electronic components, comprising: a first ceramic substrate;
   a first layer of metal or alloy foil being disposed on a first surface of said first ceramic substrate, said first layer of foil adapted for mounting at least one of said plurality of electronic components;
   a first layer of bonding glass bonding said first layer of foil to a first surface of said ceramic substrate;
   a second layer of metal or alloy foil disposed on a second surface of said ceramic substrate, said second layer of foil having at least first and second interconnected channels carrying cooling fluid to conduct heat from said module; and
   a second layer of bonding glass bonding said second layer of foil to said second surface of said first ceramic substrate.

2. The module of claim 1 wherein said first layer of foil further includes circuitry formed therein adapted for electrical connection with one or more of said plurality of electronic components.

3. The module of claim 2 further including
   at least a first through-hole extending through said first ceramic substrate; and
   a first conductor disposed in said at least a first through-hole for interconnecting said first and second foils to enhance heat transfer from said first foil to said second foil.

4. The module of claim 2 wherein said bonding glass is selected from the group consisting of silicate, borosilicate, phosphate and zinc borosilicate glasses.

5. The module of claim 4 wherein the first ceramic substrate is formed of a material selected from the group consisting of alumina having a purity of over 90%, silica, silicon carbide, zirconia, beryllia, zircon and mixtures thereof.

6. The thermally conductive module of claim 1 further including a conduit in said first layer of bonding glass formed between said first layer of foil and said ceramic substrate, carrying cooling fluid to conduct heat from said first layer of foil.

7. The thermally conductive module of claim 6 wherein said metal or alloy foil is selected of an alloy from the group consisting of deoxidized and oxygen free copper alloy.

8. The module of claim 6 further including fluid source means connected to said first and second interconnected channels and said conduit for transferring the cooling fluid to and from said module.

9. The thermally conductive module of claim 1, wherein said first and second channels are cut into said second layer of foil by electronic drilling.

10. The thermally conductive module of claim 9 wherein said first and second channels have diameters as small as about 1 mil.

11. The process of forming a thermally conductive module adapted for mounting a plurality of electronic components, comprising the steps of:
    providing a first ceramic substrate;
    providing a first layer of metal or alloy foil having a first surface adapted for mounting at least one of said plurality of electronic components;
    forming an open conduit in a second surface of said first layer of foil for carrying cooling fluid to conduct heat from said module;
    coating said second surface of said first layer of foil with a first layer of said glass, said conduit being free of said glass coating;
    providing a bonding glass;
    stacking said second surface of said first layer of foil to a first surface of said ceramic substrate with said first layer of said bonding glass therebetween whereby said conduit is closed by said ceramic substrate;
    providing a second layer of metal or alloy foil for conducting heat from said module;
    forming at least a first and second interconnected channels within said second layer of foil to carry cooling fluid;
    stacking said second layer of foil on a second surface of said first ceramic substrate with said second layer of bonding glass therebetween; and
    heating the assembly of said first and second layers of foil, said first and second layers of glass and said substrate to bond said assembly together.

12. The process of claim 11 including the step of forming said first and second channels by cutting into said second layer of foil by electronic drilling.

13. The process of claim 11 including the step of selecting said metal or alloy foil from the group consisting of deoxidized and oxygen free copper alloy.

14. The process of claim 13 further including the steps of:
    providing fluid source means; and
    connecting said fluid source means to said first and second interconnected channels and to said conduit for transferring the cooling fluid to and from said module.

15. The process of claim 14 including the step of forming circuitry in said first layer of foil being adapted for electrical connection with one or more of said plurality of electronic components.

16. The process of claim 12 wherein said first and second channels are drilled to diameters as small as about 1 mil.

17. A hermetically sealed module adapted for mounting a plurality of electronic components, comprising:
    a first ceramic substrate;
    a first layer of metal or alloy foil being disposed on a first surface of said first ceramic substrate, said first layer of foil adapted for mounting at least one of said plurality of electronic components;
    a first layer of bonding glass bonding said first layer of foil to a first surface of said ceramic substrate;
    a second layer of metal or alloy foil disposed on a second surface of said first ceramic substrate, said second layer of foil having at least a first and second channels carrying cooling fluid to conduct heat from said module;
    a second layer of bonding glass bonding said second layer of foil to said second surface of said first ceramic substrate; and
    a second ceramic substrate stacked against the second surface of said first ceramic substrate, a first surface of said second ceramic substrate being bonded to said first ceramic substrate with a third layer of said bonding glass.

18. The module of claim 17 further including at least one through-hole extending through said second ceramic substrate; and
a conductor disposed in said at least one through-hole for electrical interconnection with said second layer metal or alloy foil.

19. The module of claim 18 further including at least a first conductor pin bonded to said at least one conductor, said first conductor pin extending outward from said module.

20. The thermally conductive module of claim 17 further including a conduit in said first layer of bonding glass formed between said first layer of foil and said ceramic substrate, carrying cooling fluid to conduct heat from said first layer of foil.

21. The thermally conductive module of claim 20 wherein said metal or alloy foil is selected of an alloy from the group consisting of deoxidized and oxygen free copper alloy.

22. The module of claim 17 further including a third layer of metal or alloy foil, said third layer of foil adapted for mounting at least one of a plurality of electronic components; and
a fourth layer of said bonding glass bonding said third layer of foil to a second surface of second ceramic substrate.

23. The module of claim 22 further including at least a second conduit within said third layer of foil to carry cooling fluid for conducting heat from said module.

24. The module of claim 23 further including fluid source means connected to said first and second interconnected channels and said first and second conduits for transferring the cooling fluid to and from said module.

25. The module of claim 23 further including first and second ceramic covers; and
means for hermetically sealing said first and second covers to said first and second ceramic substrates, respectively.

26. The module of claim 25 wherein said third layer of foil includes circuitry formed therein and adapted for electrical connection to one or more of said plurality of electronic components.

27. The hermetically sealed module of claim 17 wherein said first and second channels are cut into said second layer of foil by electronic drilling.

28. The hermetically sealed module of claim 27 wherein said first and second channels have diameters as small as about 1 mil.

29. A thermally conductive module adapted for mounting a plurality of electronic components, comprising:
a first ceramic substrate;
a first layer of metal or alloy foil being disposed on a first surface of said first ceramic substrate, said first layer of foil adapted for mounting at least one of said plurality of electronic components;
a first layer of bonding glass bonding said first layer of foil to a first surface of said ceramic substrate; and
a first conduit embedded wholly within the thickness of said first layer of foil carrying cooling fluid to conduct heat from said module.

30. The thermally conductive module of claim 29 wherein said metal or alloy foil is selected of an alloy from the group consisting of deoxidized and oxygen free copper alloy.

31. The module of claim 30 further including fluid source means connected to said conduit for transferring the cooling fluid to and from said module.

* * * * *